United States Patent
Hoshizaki et al.

(10) Patent No.: US 8,357,612 B2
(45) Date of Patent: Jan. 22, 2013

(54) METHOD FOR MANUFACTURING SEMICONDUCTOR DEVICE AND SEMICONDUCTOR DEVICE

(75) Inventors: Hiroyuki Hoshizaki, Kanagawa (JP); Hidetaka Natsume, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 526 days.

(21) Appl. No.: 12/458,198

(22) Filed: Jul. 2, 2009

(65) Prior Publication Data

US 2009/0273089 A1    Nov. 5, 2009

(30) Foreign Application Priority Data

Jul. 4, 2008   (JP) ................................ 2008-176062

(51) Int. Cl.
*H01L 21/44* (2006.01)
*H01L 21/4763* (2006.01)
(52) U.S. Cl. ................. 438/672; 438/622; 438/675
(58) Field of Classification Search ............ 438/622, 438/672, 675
See application file for complete search history.

(56) References Cited

U.S. PATENT DOCUMENTS

| 7,737,563 B2 * | 6/2010 | Su et al. .................... 257/778 |
| 2005/0062161 A1 * | 3/2005 | Chen et al. ................ 257/758 |
| 2006/0166489 A1 * | 7/2006 | Hermes ....................... 438/629 |

FOREIGN PATENT DOCUMENTS

| JP | 2002-231906 | 8/2002 |
| JP | 2005-252289 | 9/2005 |

* cited by examiner

*Primary Examiner* — James Mitchell
(74) *Attorney, Agent, or Firm* — McGinn IP Law Group, PLLC

(57) ABSTRACT

A semiconductor device in which a conductor of a bit line may be made as large in thickness as possible to reduce resistance of the bit line and to reduce capacitance across the neighboring bit lines. The device includes a first interlayer film having a first contact metal part accommodated in it, and a second interlayer film. The second interlayer film includes a trench, and is deposited on the first interlayer film. The semiconductor device also includes a metal conductor filled in and protruding above the trench, and a hard mask film deposited on the metal conductor. The semiconductor device also includes sidewalls formed on lateral surfaces of the hard mask film and the metal conductor for overlying the second interlayer film, and a third interlayer film formed above the second interlayer film inclusive of the hard mask film and the sidewalls. The device also includes a contact hole opened through the third interlayer film and the second interlayer film and in the first interlayer film to expose the first contact metal part between the sidewalls. The device further includes a second contact metal part 1 in the contact hole.

18 Claims, 8 Drawing Sheets

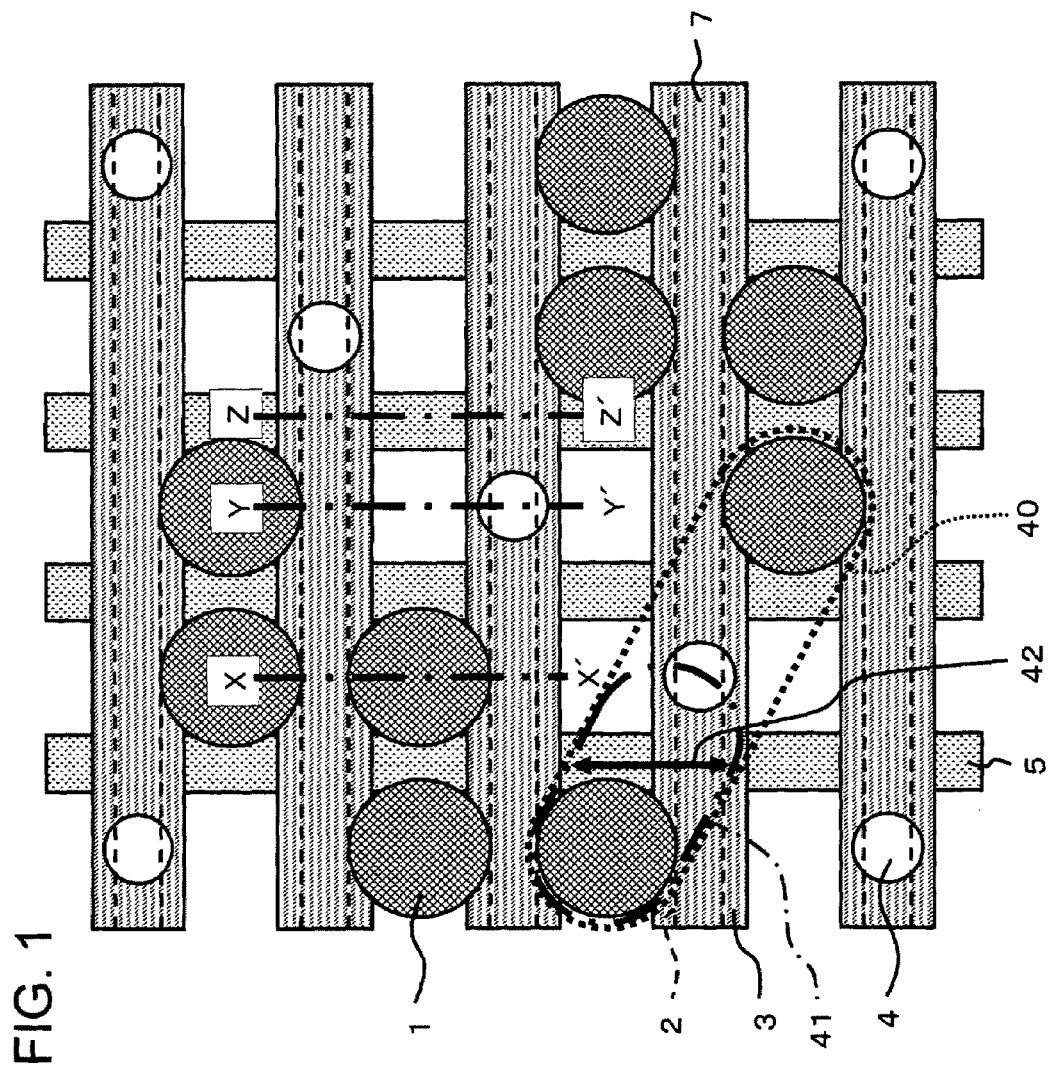

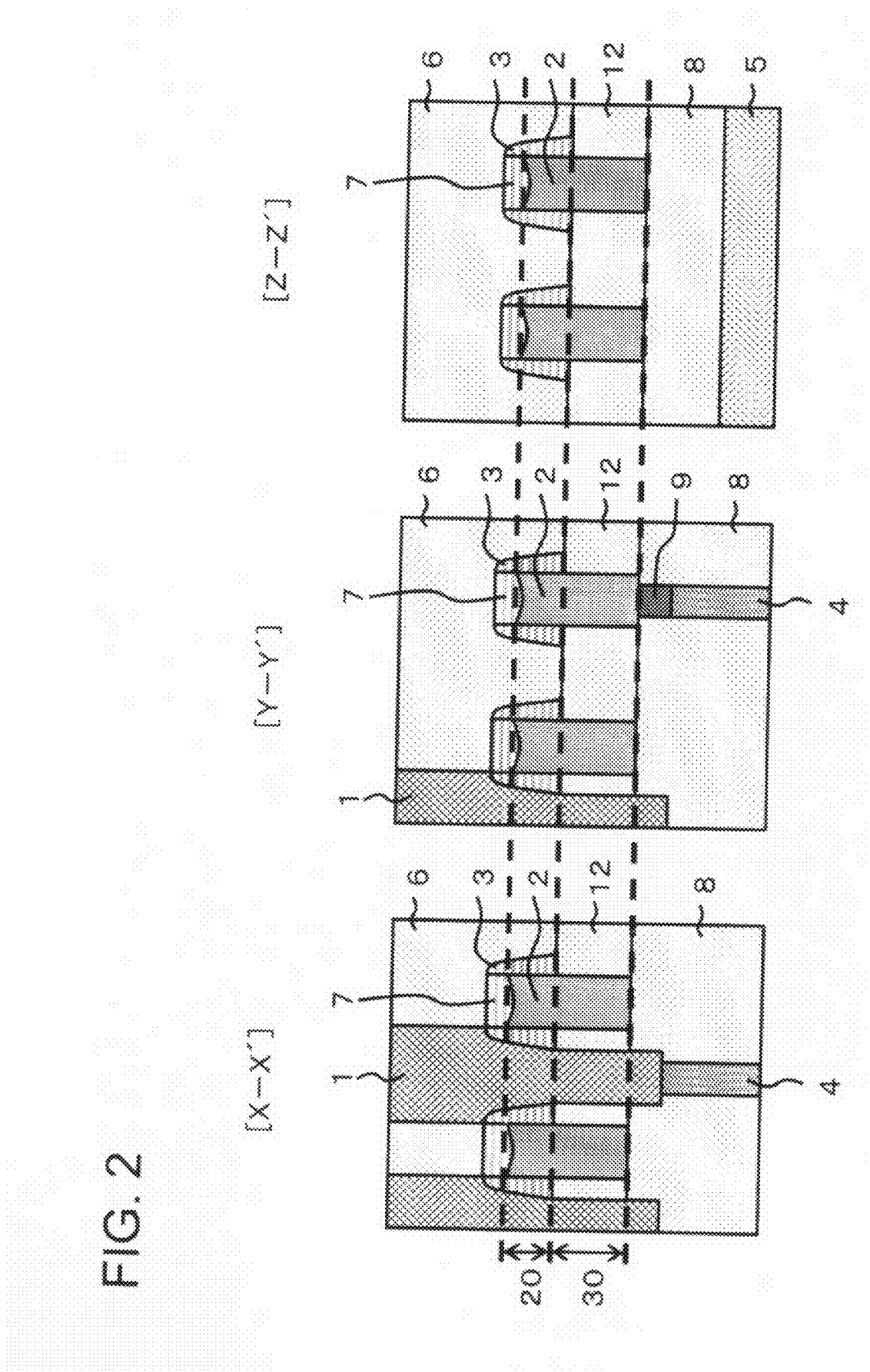

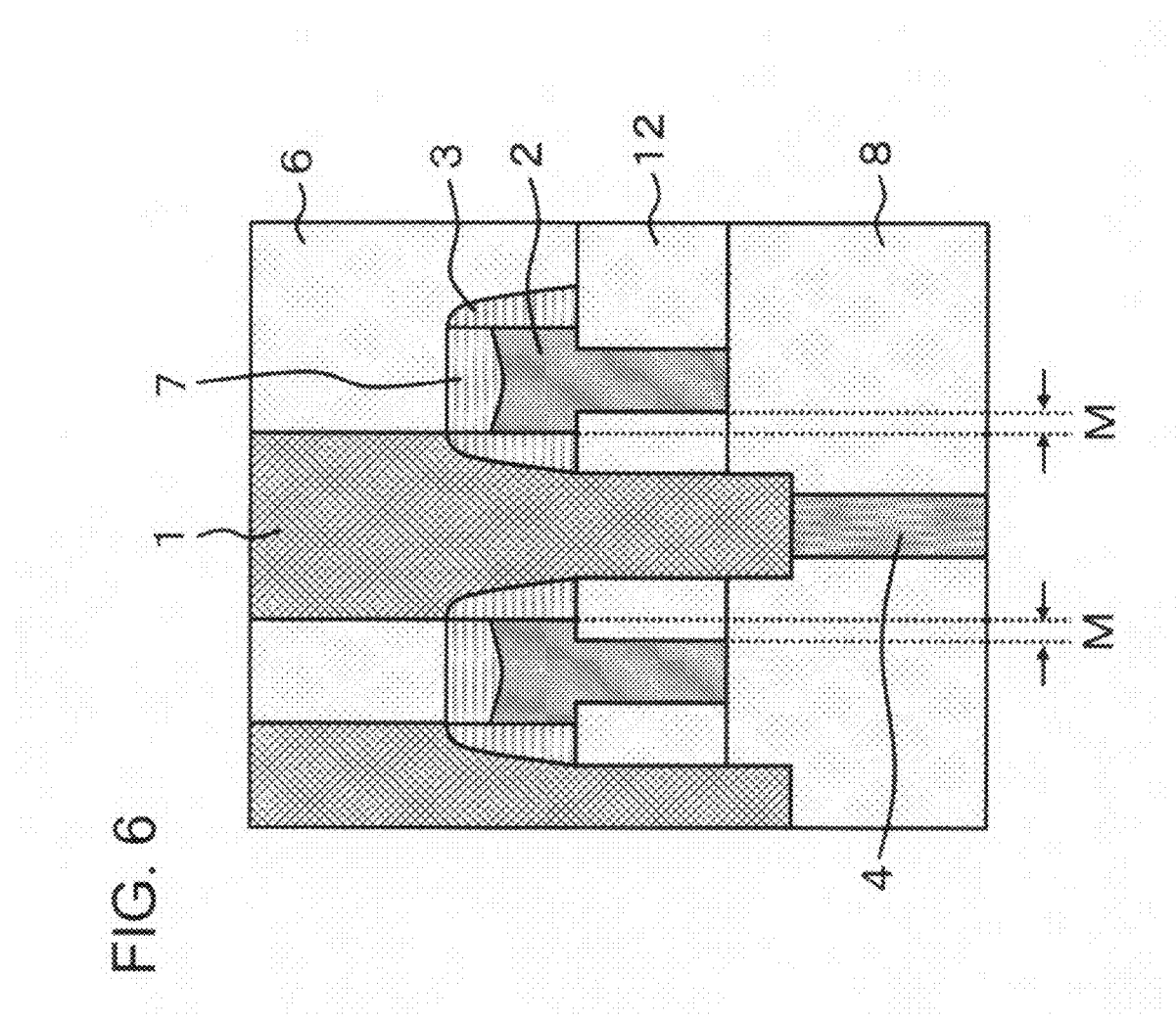

METHOD FOR MANUFACTURING SEMICONDUCTOR DEVICE AND SEMICONDUCTOR DEVICE

TECHNICAL FIELD

This application is based upon and claims the benefit of the priority of Japanese patent application No. 2008-176062, filed on Jul. 4, 2008, the disclosure of which is incorporated herein in its entirety by reference thereto.

This invention relates to a method for manufacturing a semiconductor device having a bit line of a DRAM, and to a semiconductor device.

BACKGROUND

Currently, bit lines of a cell of a DRAM (Dynamic Random Access Memory) are prevalently formed of tungsten. It is noted that lowering the resistance of the bit lines bears significantly on device miniaturization. To lower the resistance of the bit lines, it is necessary to make a conductor as large in diameter or in thickness as possible. One of means for increasing the diameter of the conductor is a SAC (Self-Aligned Contact) structure which allows increasing the diameter of the conductor without the necessity of taking account of alignment tolerance of the conductor with respect to a contact therefor.

FIGS. 7A-7C and FIGS. 8A-8C show a method used for manufacturing bit lines for a DRAM by SAC of a type such as disclosed in Patent Document 1.

Initially, a cell contact metal part 4 is formed and a bit contact metal part, not shown, is formed thereon. A contact metal part interlayer insulating film 8 is then deposited over the cell contact metal part 4 (see FIG. 7A). The contact metal part interlayer insulating film 8 is referred to below as a 'contact interlayer film 8'. A laminate (dual-layer) film 11, formed by a polysilicon film and a layer of high-melting low-resistance metal part, is then deposited on the contact interlayer film 8. The laminate film is to form a bit line. A hard mask film 7, which is a silicon nitride film, is then deposited thereon (see FIG. 7B). The hard mask film 7 and the laminate film (11 of FIG. 7B) are then patterned to form bit lines 2 (see FIG. 7C).

A silicon nitride film is then formed on the entire surface of the contact interlayer film 8 inclusive of the bit line 2. This silicon nitride film is then etched back to form a sidewall 3 on a lateral surface of the bit line 2 (see FIG. 8A). A capacitive contact metal part interlayer insulating film 6, used to form a capacitive contact metal part (1 of FIG. 8C), is then deposited. The capacitive contact metal part interlayer insulating film 6 is referred to below as a 'capacitive contact interlayer film 6'. After planarizing the surface by annealing, etchback or CMP (see FIG. 8B), the capacitive contact interlayer film 6 and the contact interlayer film 8 are removed by patterning to expose the cell contact metal part 4 to form a self-aligned contact hole. This self-aligned contact hole is then filled with the capacitive contact metal part 1 (see FIG. 8C).

In Patent Document 2, there is disclosed a method for manufacturing a semiconductor integrated circuit. Specifically, in a DRAM having an information storage capacitance device on top of a bit line, a trench for a conductor is formed in an insulating film deposited on a gate electrode operating as a word line of the DRAM. The conductor is formed in this insulating film. A sidewall spacer is constructed on a lateral surface of the trench for the conductor. A bit line, formed as a tungsten film, for example, is deposited in the trench for the conductor, the width of which has been narrowed by the sidewall spacer. The bit line is connected via a connection plug to the semiconductor substrate, and the bit line is connected to the connection plug at the bottom of the trench for the conductor.

[Patent Document 1]
JP Patent Kokai Publication No. JP2002-231906A
[Patent Document 2]
JP Patent Kokai Publication No. JP2005-252289A

SUMMARY

The disclosure of the above Patent Documents are incorporated herein by reference thereto. Now, the following analyses are given by the present invention.

However, the conductor cannot be increased in width in light of the demand for cell miniaturization. Thus, to lower the resistance of a conductor, it is necessary to increase its thickness. However, simply increasing the film thickness by growth is difficult due to lithographic constraints. For example, with the bit line of Patent Document 1 (corresponding to 2 of FIG. 8C), it is difficult to increase the film thickness due to lithographic constraints. Specifically, the thickness of the bit line cannot exceed the limit value of the ratio of the height H3 to width L of the conductor (H3/L) of about 2, such that it is difficult to reduce the resistance of the conductor.

If the cell miniaturization continues further from now on, with the bit line width (tungsten part width) being narrower, it will become more difficult to use the tungsten part as a bit line. With the bit line such as is met in Patent Document 2, for example, the resistance of the bit line will become higher, as the bit line becomes finer in diameter with progress in cell miniaturization, even though the capacitance between bit lines is decreased.

It is an object of the present invention to provide a semiconductor device in which a conductor for a bit line may be made as large in thickness as possible to provide for a low resistance of the bit line and a low capacitance across two neighboring bit lines.

In one aspect of the present invention, there is provided a method for manufacturing a semiconductor device including: forming a second interlayer film, including a trench, on a first interlayer film that has a first contact metal part accommodated therein, and forming a metal part on the second interlayer film including the trench. The metal part later becomes a metal conductor. The method also includes the steps of forming a hard mask film on the metal part, etching the hard mask film and the metal part to form the metal conductor filled in and protruding above the trench, and forming sidewalls on lateral surfaces of the hard mask film and the metal conductor above the second interlayer film.

In another aspect of the present invention, there is provided a semiconductor device including a first interlayer film having a first contact metal part accommodated therein, and a second interlayer film deposited on the first interlayer film and including a trench. The semiconductor device also includes a metal conductor filled in and protruding above the trench, a hard mask film deposited on the metal conductor, and sidewalls formed on lateral surfaces of the hard mask film and the metal conductor disposed above the second interlayer film.

The meritorious effects of the present invention are summarized as follows.

According to the present invention, it becomes possible to further increase the film thickness of the bit line (metal conductor) in comparison with the conventional technique, thereby reducing the resistance of the bit line. Even if the bit line is made thicker, the sidewall remains unchanged in height, and hence the capacitance between neighboring bit line layers may be reduced to allow for further DRAM chip miniaturization.

BRIEF DESCRIPTION OF THE DRAWINGS

FIG. 1 is a partial top plan view schematically showing an interconnect structure of a semiconductor device according to Example 1 of the present invention.

FIG. 2 depicts cross-sectional views, taken along lines X-X', Y-Y' and Z-Z' of FIG. 1, and schematically shows the interconnect structure of the semiconductor device according to Example 1 of the present invention.

FIG. 6 is a partial cross-sectional view schematically showing a formulation of a semiconductor device according to Example 2 of the present invention.

PREFERRED MODES

Figure 3A:
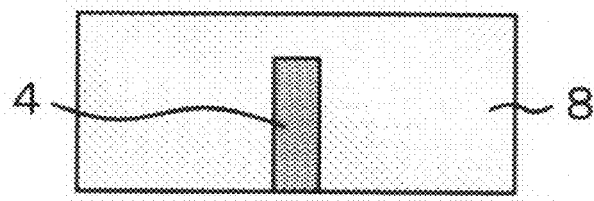
FIGS. 3A to 3D are cross-sectional views, corresponding to cross-sections taken along line X-X' of FIG. 1, and schematically show the first process step of the method for manufacturing the semiconductor device according to Example 1 of the present invention.

In an exemplary embodiment, the present invention provides a method for manufacturing a semiconductor device including a step (FIG. 3C) of forming a second interlayer film (12 of FIG. 3), including a trench (10 of FIG. 3), on a first interlayer film (8 of FIG. 3) having a first contact metal part (4 of FIG. 3) accommodated therein, and a step (FIG. 3D) that forms a metal part (11 of FIG. 3) on the second interlayer film (12 of FIG. 3) including the trench (10 of FIG. 3). The metal part is adapted to later become a metal conductor. The method also includes a step (FIG. 3D) that forms a hard mask film (7 of FIG. 3) on the metal part (11 of FIG. 3), and a step (FIG. 4A) that etches the hard mask film (7 of FIG. 3) and the metal part (11 of FIG. 3) to form a metal conductor (2 of FIG. 4) filled in and protruding above the trench (10 of FIG. 3). The method further includes a step (FIG. 4B) that forms a sidewall (3 of FIG. 4) on each of lateral surfaces of the hard mask film (7 of FIG. 4) and the metal conductor (2 of FIG. 4) disposed above the second interlayer film (12 of FIG. 4).

In another exemplary embodiment, the present invention provides a semiconductor device including a first interlayer film (8 of FIG. 2) having a first contact metal part (4 of FIG. 2) accommodated therein, and a second interlayer film (12 of FIG. 2) deposited on the first interlayer film (8 of FIG. 2) and including a trench. This trench is filled with an in-bit-line-trench conductor portion 30 of FIG. 2. The semiconductor device also includes a metal conductor (2 of FIG. 2) filled in and protruding above the trench, a hard mask film (7 of FIG. 2) deposited on the metal conductor (2 of FIG. 2) and sidewalls (3 of FIG. 2) formed on lateral surfaces of the hard mask film (7 of FIG. 2) and the metal conductor (2 of FIG. 2) disposed above the second interlayer film (12 of FIG. 2).

Example 1

Referring to the drawings, a semiconductor device according to Example 1 of the present invention is now described. FIG. 1 depicts a schematic top plan view showing an interconnect structure of the semiconductor device according to Example 1 of the present invention. FIG. 2 shows three partial cross-sectional views, taken along lines X-X', Y-Y' and Z-Z' of FIG. 1, and schematically shows an interconnect structure of the semiconductor device according to Example 1.

Referring to FIG. 1, there are formed multilevel interconnect layers on top of transistors, not shown, provided on a substrate of the semiconductor device. The multilevel interconnect layers comprise a plurality of word lines 5 and a plurality of bit lines 2. The word lines and the bit lines are formed for extending in a vertical direction and in a transverse direction in FIG. 1, respectively. A region surrounded by a broken line ellipsis in FIG. 1 schematically represents a 2-bit region 40 of DRAM memory cells. It is observed that, even though the broken line ellipsis is not intended to represent a diffusion layer of the MOSFET, the shape of the diffusion layer roughly corresponds to this shape.

The word line 5 is covered by a contact interlayer film 8 formed of an insulating material (see FIG. 2). The word line 5 is adapted to become a gate electrode, not shown, of a memory cell.

The bit line 2 is a metal conductor arranged above the word line 5 and crossing it with an overpass (see FIGS. 1 and 2). The bit line 2 includes an in-bit-line-trench conductor portion 30 that fills a trench opened in an in-trench conductor accommodating insulating interlayer film 12 disposed below an interface between the in-trench conductor accommodating insulating interlayer film 12 and a capacitive contact interlayer film 6. The in-trench conductor accommodating insulating interlayer film 12 is referred to below as an in-trench conductor accommodating interlayer film. The bit line 2 includes an upper bit line layer forming conductor portion 20 disposed above the interface between the capacitive contact interlayer film 6 and the in-trench conductor accommodating interlayer film 12. The upper bit line layer forming conductor portion 20 has its upper surface covered with a hard mask film 7, while having its lateral surface covered with sidewalls 3. The bit lines 2 are electrically connected to source/drain electrodes, not shown, of a memory cell via a bit contact metal part 9 and a cell contact metal part 4.

A capacitive contact metal part 1 is electrically connected to a capacitor, not shown. The capacitive contact metal part 1 is filled in a void region free of the word line 5 or the bit line 2 in holes opened in the capacitive contact interlayer film 6, between the sidewalls, in the in-trench conductor accommodating interlayer film 12 and in the contact interlayer film 8. The capacitive contact metal part 1 is electrically connected to the cell contact metal part 4 accommodated in the contact interlayer film 8.

The sidewalls 3 serve as an insulator that covers the lateral surfaces of the bit line 2 and the hard mask film 7 above the in-trench conductor accommodating interlayer film 12. The sidewall 3 is formed of an insulator which is of the same type as the hard mask film 7 and which has an etching selectivity ratio different from that of the capacitive contact interlayer film 6 or that of the in-trench conductor accommodating interlayer film 12. The sidewall 3 may, for example, be a silicon nitride film. The sidewall 3 is an insulating film, e.g., having a value of the dielectric constant higher than that of the capacitive contact interlayer film 6 or that of the in-trench conductor accommodating interlayer film 12. The sidewall 3 acts as a mask when opening holes for the capacitive contact metal 1 in the capacitive contact interlayer film 6, in-trench conductor accommodating interlayer film 12 and in the contact interlayer film 8. The sidewalls 3 as well as the hard mask film 7 are covered with the capacitive contact interlayer film 6.

The cell contact metal part 4 is electrically connected to source/drain electrodes of a memory cell, not shown. The cell contact metal part 4 is charged in a hole opened in the contact interlayer film 8. There are two sorts of the cell contact metal part 4. The first sort of the cell contact metal part 4 is electrically connected to the capacitive contact metal part 1 (see a cross-sectional view taken along line X-X' of FIG. 2). The second sort of the cell contact metal part 4 is electrically connected to the bit line 2 via the bit contact metal part 9 (see a cross-sectional view taken along line Y-Y' of FIG. 2).

The capacitive contact interlayer film 6 is an interlayer insulating film having a hole which is to be filled with the capacitive contact metal part 1. The capacitive contact interlayer film 6 is formed of an insulator which is of the same type as the in-trench conductor accommodating interlayer film 12 and the contact interlayer film 8 and which has an etching selectivity ratio different from that of the sidewall 3 or the hard mask film 7. The capacitive contact interlayer film 6 may, for example, be a silicon oxide film. The capacitive contact interlayer film 6 is formed on the in-trench conductor accommodating interlayer film 12 to cover the hard mask film 7 and the sidewalls 3. In a void region free of the word line 5 and the bit line 2, the capacitive contact interlayer film 6 is provided with a hole communicating with a hole opened in the in-trench conductor accommodating interlayer film 12, between the sidewalls 3, and with a hole formed in the contact interlayer film 8. The capacitive contact metal part 1 is filled in these holes.

The hard mask film 7 is an insulating film deposited on the bit line 2. The hard mask film 7 is formed of an insulator which is of the same type as the sidewall 3 and which has an etching selectivity ratio different from that of the capacitive contact interlayer film 6 or the in-trench conductor accommodating interlayer film 12. The sidewall 3 may, for example, be a silicon nitride film. The hard mask film 7 operates as a mask when forming the holes for the capacitive contact metal part 1 in the capacitive contact interlayer film 6, in-trench conductor accommodating interlayer film 12 and in the contact interlayer film 8. The lateral wall surfaces of the hard mask film 7 as well as the lateral wall surfaces of the bit line 2 are covered with the sidewalls 3. The hard mask film 7 as well as the sidewalls 3 are covered with the capacitive contact interlayer film 6.

The contact interlayer film 8 is an interlayer insulating film in which the cell contact metal part 4 is accommodated. The contact interlayer film 8 is formed of an insulator which is of the same type as the capacitive contact interlayer film 6 and the in-trench conductor accommodating interlayer film 12 and which has an etching selectivity ratio different from that of the sidewalls 3 or that of the hard mask film 7. The contact interlayer film may, for example, be a silicon oxide film. The contact interlayer film 8 is formed on transistors, not shown, formed in turn on a semiconductor substrate, also not shown, so as to cover (overlay) the word line 5. In the contact interlayer film 8, there is opened a hole in which to accommodate the cell contact metal part 4 and the bit contact metal part 9, at a preset position below the bit line 2. In the contact interlayer film 8, there are thus opened the hole to accommodate a portion of the capacitive contact metal part 1 and the hole to accommodate the cell contact metal part 4.

The bit contact metal part 9 electrically connects the bit line 2 to the cell contact metal part 4. The bit contact metal part 9 is formed on top of the cell contact metal part 4 in the hole that is opened in the contact interlayer film 8 below the bit line 2.

The in-trench conductor accommodating interlayer film 12 is an interlayer insulating film provided with a hole to accommodate the in-bit-line-trench conductor portion 30 of the bit line 2. The in-trench conductor accommodating interlayer film 12 is formed of an insulator which is of the same type as the capacitive contact interlayer film 6 and the contact interlayer film 8 and which has an etching selectivity ratio different from that of the side wall 3 or that of the hard mask film 7. The in-trench conductor accommodating interlayer film 12 may, for example, be a silicon oxide film, and is formed between the contact interlayer film 8 and the capacitive contact interlayer film 6. The in-trench conductor accommodating interlayer film 12 is provided with a hole at a preset position between the sidewalls 3. This hole is to be filled with a portion of the capacitive contact metal part 1.

The semiconductor device according to Example 1 of the present invention is now described with reference to the drawings. FIGS. 3A to 5B are cross-sectional views illustrating the method for manufacturing the semiconductor device according to Example 1 of the present invention. The cross-sectional views are taken along the line X-X' of FIG. 1, and illustrate respective process steps of the method for manufacturing the semiconductor device according to Example 1 of the present invention.

Figure 4A:
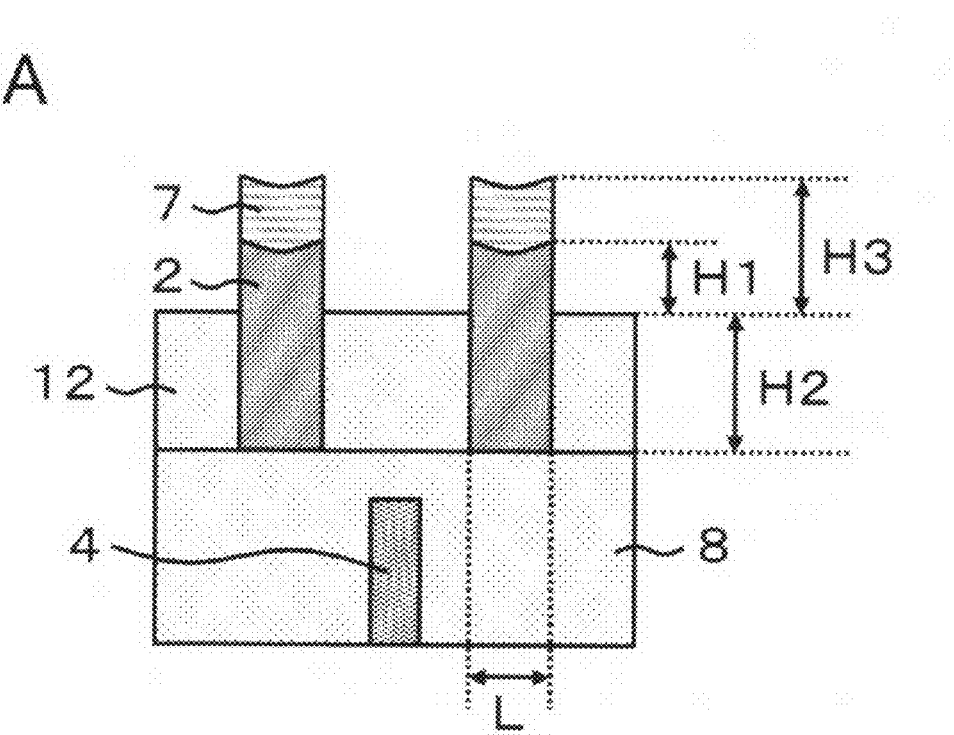
FIGS. 4A and 4B are cross-sectional views, corresponding to cross-sections taken along line X-X' of FIG. 1, and schematically show the second process step of the method for manufacturing the semiconductor device according to Example 1 of the present invention.

Initially, a substrate is prepared in step A1 (see FIG. 3A). The substrate prepared is comprised of a contact interlayer film 8 provided with a cell contact metal part 4 and with a bit contact metal part (9 of FIG. 2).

Figure 3B:
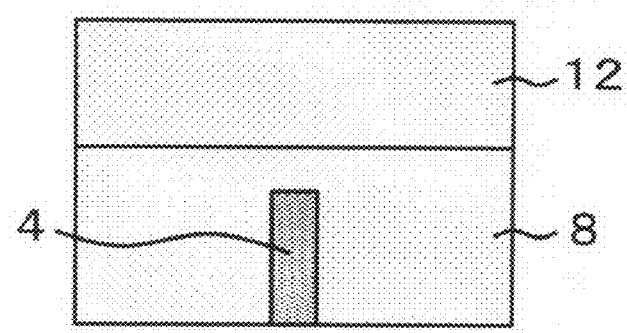
Figure 3C:
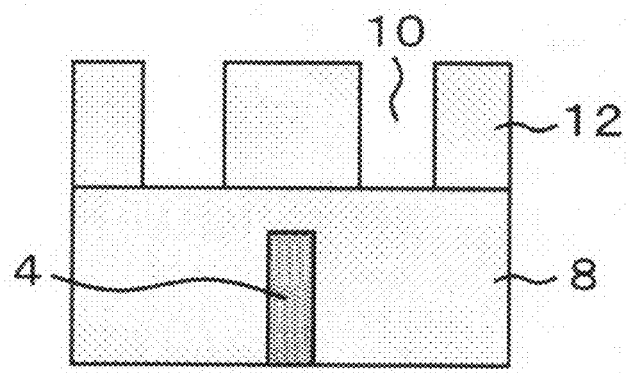

An in-trench conductor accommodating interlayer film 12 is then deposited in step A2 (see FIG. 3B). In this in-trench conductor accommodating interlayer film, the in-bit-line-trench conductor portion (30 of FIG. 2) of the bit line (2 of FIG. 2) is to be formed.

A resist of a preset pattern then is formed on top of the in-trench conductor accommodating interlayer film 12. Then, using the resist as a mask, the in-trench conductor accommodating interlayer film 12 is etched in step A3 to form a trench 10 to accommodate therein the in-bit-line-trench conductor portion (30 of FIG. 2) of the bit line (2 of FIG. 2) (see FIG. 3C). It is observed that, for forming (opening) the trench, a positive type photoresist for patterning is applied on the in-trench conductor accommodating interlayer film 12, and the positive type photoresist is exposed to light to a preset pattern. This pattern is developed, and the in-trench conductor accommodating interlayer film 12 is then etched, using the photoresist as a mask. The trench opened is to be deep enough to expose the bit contact metal part (9 of FIG. 2) on an interface between the contact interlayer film 8 and the in-trench conductor accommodating interlayer film 12. The photoresist is removed following the etching.

Figure 3D:
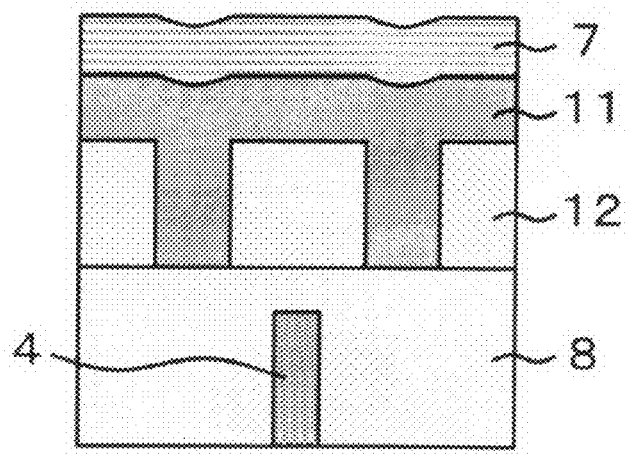

A metal part 11, which is destined to become the bit line, is then deposited in step A4 as a film on the in-trench conductor accommodating interlayer film 12 (see FIG. 3D). Meanwhile, the hard mask film 7 is formed of an insulator, such as silicon nitride, having a selectivity ratio different from that of the capacitive contact interlayer film 6 or the in-trench conductor accommodating interlayer film 12.

A photoresist of a preset pattern then is formed on the hard mask film 7. Then, using the photoresist as a mask, the hard mask film 7 and the metal part 11 are etched to form the bit line 2 in step A5 (see FIG. 4A). It is observed that the bit line 2 may be formed by coating a positive type photoresist for patterning on the hard mask film 7, exposing the positive type photoresist to light to a preset pattern, developing the pattern, and by etching the hard mask film 7 and the metal part 11, using the photoresist as a mask. The photoresist is removed following the etching.

Figure 4B:
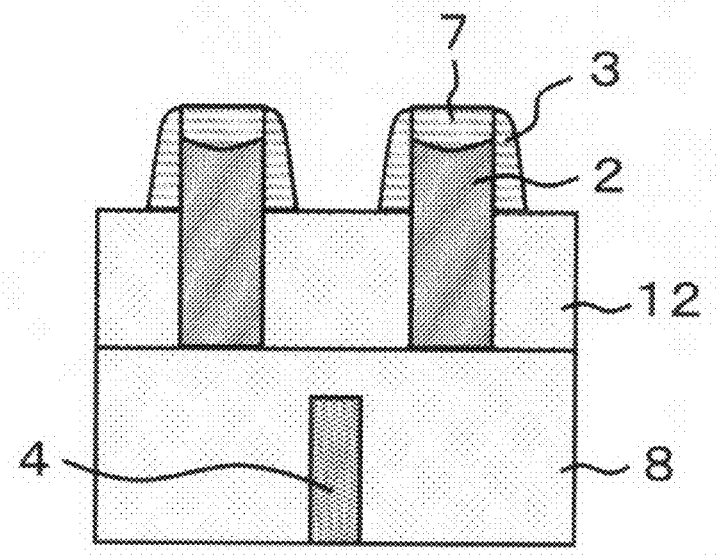

A silicon nitride film is then deposited in step A6 on the in-trench conductor accommodating interlayer film 12, inclusive of the bit line 2, and the silicon nitride film is then etched back to form the sidewall 3 on the lateral surfaces of the bit line 2 and the hard mask film 7 (see FIG. 4B). It is observed that the sidewall 3 may be formed not only by a silicon nitride film but also by a film of any suitable insulating material having a selectivity ratio different from that of the capacitive contact interlayer film 6 or the in-trench conductor accommodating interlayer film 12.

Figure 5A:
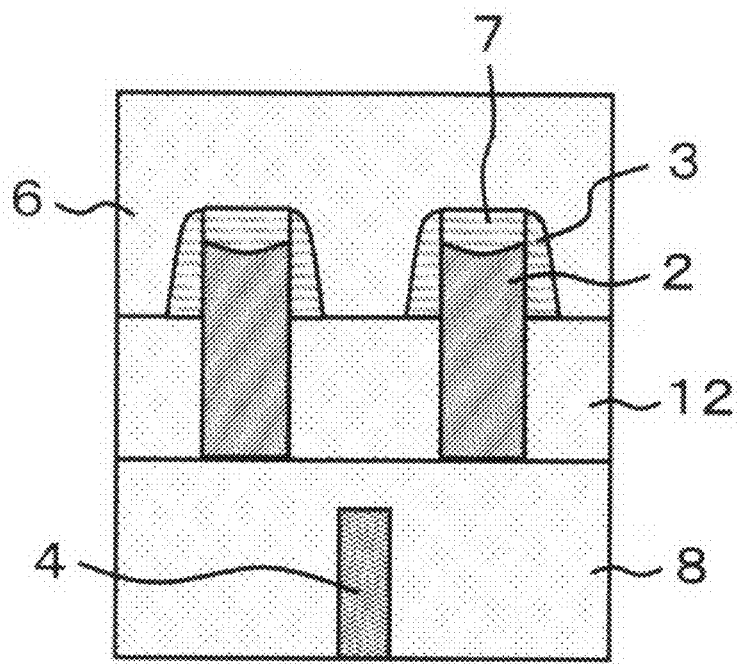
FIGS. 5A and 5B are cross-sectional views, corresponding to cross-sections taken along line X-X' of FIG. 1, and schematically show the third process step of the method for manufacturing the semiconductor device according to Example 1 of the present invention.
Figure 5B:
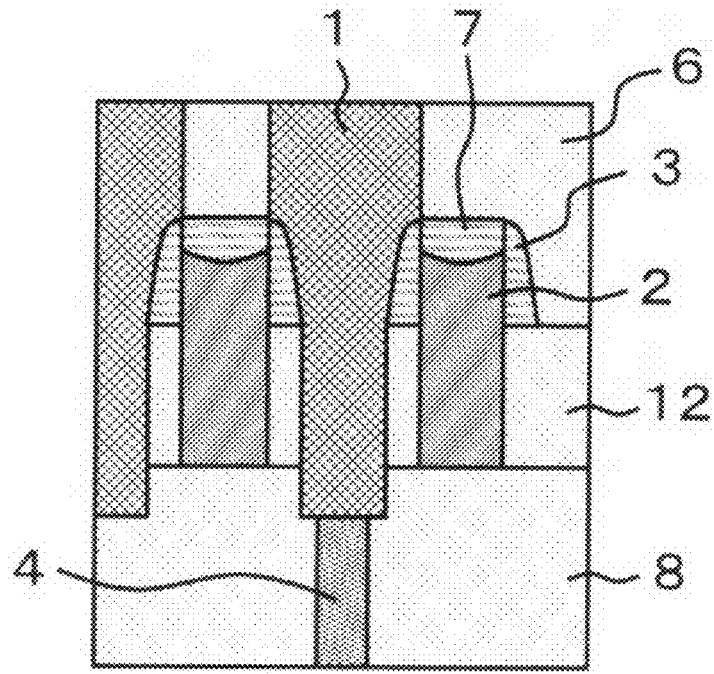
Figure 7A:
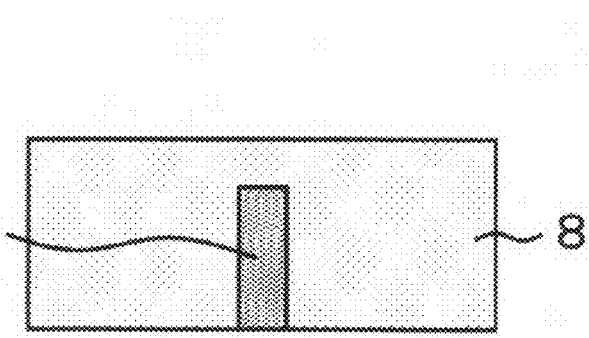
FIGS. 7A to 7C are cross-sectional views schematically showing a first step of the method for manufacturing a semiconductor device according to a conventional technique.
Figure 7B:
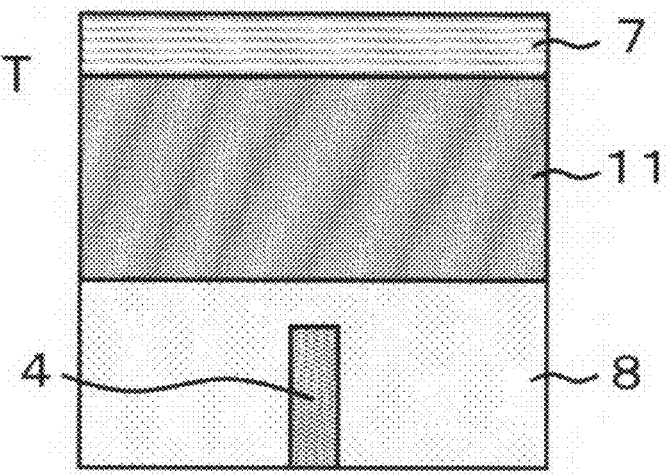
Figure 7C:
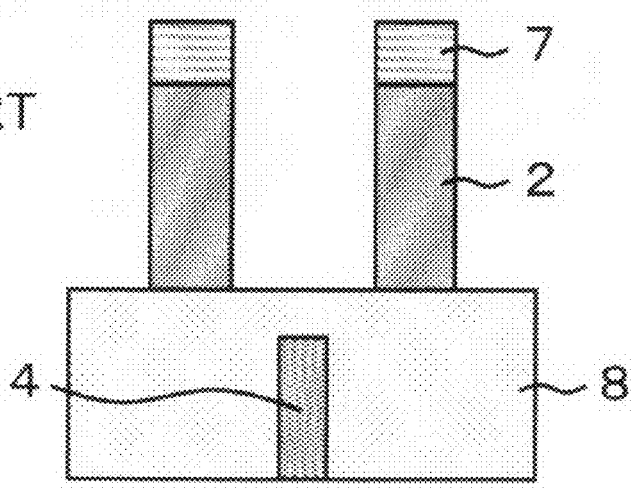

The capacitive contact interlayer film 6 then is formed in step A7 on top of the in-trench conductor accommodating interlayer film 12 inclusive of the hard mask film 7 and the sidewall 3 (see FIG. 5A).

A photoresist is then formed to a preset pattern on the capacitive contact interlayer film 6. Then, using the photoresist as a mask, the capacitive contact interlayer film 6, in-trench conductor accommodating interlayer film 12 and the contact interlayer film 8 are etched in step A8 by a self-aligned process to expose the cell contact metal part 4. This should form a self-aligned contact hole to be filled with the capacitive contact metal part 1 (see FIG. 5B). It is observed that the self-aligned contact hole may be form (opened) by coating a positive type photoresist for patterning on the capacitive contact interlayer film 6, exposing the positive type photoresist to light to a preset pattern, developing the pattern, and by etching the capacitive contact interlayer film 6, in-trench conductor accommodating interlayer film 12 and the contact interlayer film 8, to expose the cell contact metal part 4, using the photoresist as a mask. The capacitive contact interlayer film 6, in-trench conductor accommodating interlayer film 12 and the contact interlayer film 8 exhibit a sufficient etching selectivity with respect to the sidewalls 3 and the hard mask film 7 and hence can be etched by a self-alignment technique.

A metal part is then charged in the self-aligned contact hole opened in the capacitive contact interlayer film 6, in-trench conductor accommodating interlayer film 12 and in the contact interlayer film 8. The capacitive contact metal part 1 is deposited in step A9 using CMP (see FIG. 5B). This completes a semiconductor device of the bit line SAC structure.

Figure 8A:
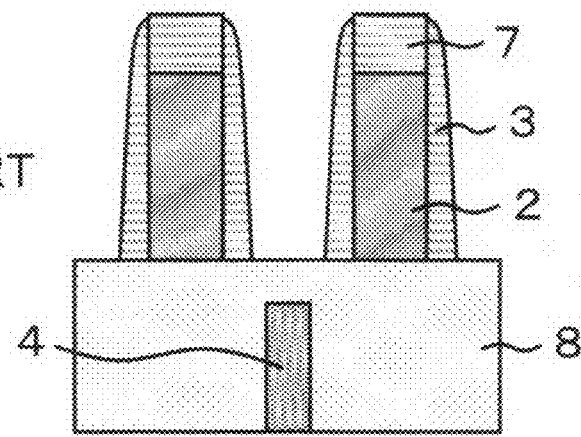
FIGS. 8A to 8C are cross-sectional views schematically showing a second step of the method for manufacturing the semiconductor device according to a conventional technique.
Figure 8B:
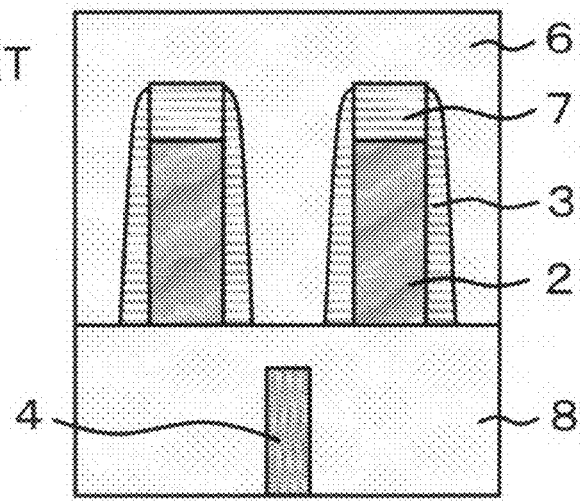
Figure 8C:
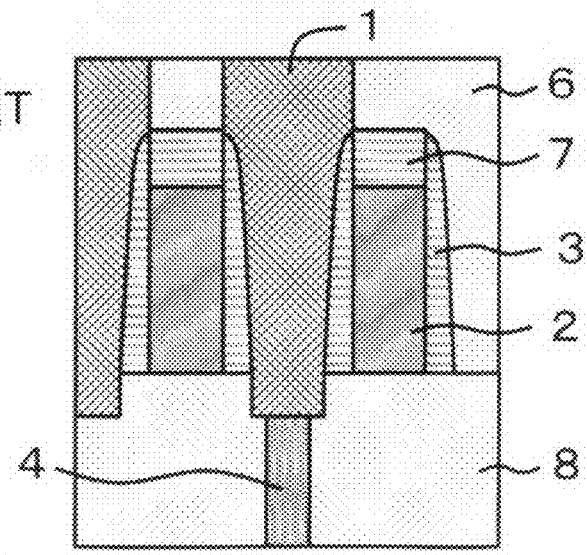

With the Example 1, in which the trench (10 of FIG. 3) is formed before forming the bit line 2 of the SAC structure, the film thickness of the bit line 2 may be thicker than that of the bit line of the conventional technique (see FIG. 8C). Hence, the bit line may be lower in resistance than the bit line of the conventional technique (2 of FIG. 8). Moreover, since the lateral surface of the portion of the bit line 2 that has been increased in film thickness (H2 of FIG. 4A) lacks the sidewalls 3, it is possible to reduce the capacitance across the neighboring bit lines. In addition, the bit line resistance may be reduced to a half or less of that of the conventional technique (see FIG. 8C) by setting the depth (H2 of FIG. 4A) of the in-bit-line-trench conductor portion (30 of FIG. 2) so as to be larger than the height (H1 of FIG. 4A) of the upper bit line layer forming conductor portion (20 of FIG. 2). Furthermore, the sidewalls 3, formed by an insulating film higher in dielectric constant than the silicon oxide film, routinely used as an interlayer insulating film, such as silicon nitride, are formed only for the upper bit line layer forming conductor portion (20 of FIG. 2), that is, the height of the sidewall 3 is not increased despite the increase in the film thickness of the bit line 2. As a result, the capacitance across neighboring bit lines is decreased, thus leading to further miniaturization of a DRAM chip.

Example 2

A semiconductor device according to Example 2 of the present invention is now described with reference to the drawings. FIG. 6 depicts a partial cross-sectional view schematically showing a formulation of a semiconductor device according to Example 2 of the present invention. Meanwhile, FIG. 6 shows a cross-section taken along line X-X' of FIG. 1.

In Example 1 (see FIG. 2), the in-bit-line-trench conductor portion (30 of FIG. 2) and the upper bit line layer forming conductor portion (20 of FIG. 2) of the bit line (2 of FIG. 2) are the same in width. In Example 2, the width of the in-bit-line-trench conductor portion 30 of the bit line 2 is set so as to be narrower by a value M on each side than that of its upper bit line layer forming conductor portion 20. It should be noted that, since the trench (equivalent to 10 of FIG. 3C) is formed in the in-trench conductor accommodating interlayer film 12, it is necessary to add one step to the photolithographic steps, which might lead to misalignment between the in-bit-line-trench conductor portion 30 and the upper bit line layer forming conductor portion 20. With the present Example, the width of the in-bit-line-trench conductor portion 30 is set so as to be narrower by the value M corresponding to the possible misalignment on each side than that of the upper bit line layer forming conductor portion 20. This should suppress misalignment which might otherwise be produced between the in-bit-line-trench conductor portion 30 and the upper bit line layer forming conductor portion 20.

The method for manufacturing the semiconductor device according to Example 2 is similar to that of Example 1 except narrowing the width of the trench (10 of FIG. 3C) in the step (step A3) of opening the trench (10 of FIG. 3C) in the in-trench conductor accommodating interlayer film (12 of FIG. 2) of Example 1. In this trench is to be accommodated the in-bit-line-trench conductor portion (30 of FIG. 2) of the bit line (2 of FIG. 2).

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for manufacturing a semiconductor device, said method comprising:
   forming a second interlayer film on a first interlayer film having a first contact metal part accommodated therein, wherein said first interlayer film contacts said first contact metal part;
   forming a trench in said second interlayer film;
   forming a metal part on said second interlayer film including said trench;
   forming a hard mask film on said metal part;
   etching said hard mask film;
   etching said metal part to form a metal conductor filled in and protruding above said trench;
   forming sidewalls on lateral surfaces of said hard mask film and said metal conductor above said second interlayer film;

forming third interlayer film on top of said second interlayer film inclusive of said hard mask film and said sidewalls;

selectively etching said third interlayer film, said second interlayer film and the first interlayer film, to open a self-aligned contact hole between said sidewalls to expose said first contact metal part; and forming a second contact metal part in said self-aligned contact hole.

2. The manufacturing method according to claim 1, wherein, in said forming said second interlayer film, said second interlayer film is formed so that said trench has a width narrower than that of a portion of said metal conductor protruded above said trench.

3. The manufacturing method according to claim 1, wherein, in said forming said metal part, said metal part is formed so that a portion of said metal part overlying said second interlayer film is thinner in thickness than a depth of said trench.

4. The manufacturing method according to claim 1, wherein said metal conductor comprises a bit line of a DRAM.

5. A semiconductor device comprising:
a first interlayer film having a first contact metal part accommodated therein, wherein said first interlayer film contacts said first contact metal part;
a second interlayer film deposited on said first interlayer film, said second interlayer film including a trench;
a metal conductor filled in and protruding above said trench;
a hard mask film deposited on said metal conductor;
a first sidewall formed on a first lateral surface of said hard mask film and said metal conductor and a second sidewall formed on a second lateral surface of said hard mask and said metal conductor;
a third interlayer film formed on a top surface of said second interlayer film inclusive of said hard mask film and said first and second sidewalls;
a contact hole opened through said third interlayer film and said second interlayer film and in said first interlayer film, to expose said first contact metal part; and
a second contact metal part provided in said contact hole and contacting one of said first and second sidewalls,
wherein said first and second sidewalls are disposed above said second interlayer film.

6. The semiconductor device according to claim 5, wherein an in-trench portion of said metal conductor has a width narrower than that of a portion thereof protruded above said trench.

7. The semiconductor device according to claim 5, wherein said portion of said metal conductor protruded above said trench has a thickness thinner than a depth of said trench.

8. The semiconductor device according to claim 5, wherein said first and second sidewalls are formed of an insulating material having a ratio of etch selectivity different from that of said first interlayer film, that of said second interlayer film, and that of said third interlayer film.

9. The semiconductor device according to claim 5, wherein said first and second sidewalls comprise an insulating film having a dielectric constant higher than that of said first interlayer film, that of said second interlayer film, and that of said third interlayer film.

10. The semiconductor device according to claim 5, wherein said metal conductor comprises a bit line of a DRAM.

11. The semiconductor device according to claim 5, wherein said second contact metal part is coupled with said first contact metal part.

12. The semiconductor device according to claim 5, further comprising a bit contact metal part coupled with said first contact metal part.

13. The semiconductor device according to claim 5, wherein an in-trench portion of said metal conductor has a height that is larger than a height of an above-trench portion of said metal conductor.

14. The semiconductor device according to claim 5, wherein said first and second sidewalls comprise an insulating film with a higher dielectric constant than that of silicon oxide.

15. The semiconductor device according to claim 5, further comprising:
a word line that is covered by said first interlayer film; and
a bit line arranged above a top surface of said word line.

16. The semiconductor device according to claim 5, wherein said first contact metal part is positioned below a top surface of said first interlayer film.

17. The semiconductor device according to claim 5, wherein said first contact metal part is entirely within said first interlayer film.

18. A semiconductor device comprising:
a first interlayer film having a first contact metal part accommodated therein;
a second interlayer film deposited on said first interlayer film, said second interlayer film including first and second trenches;
first and second metal conductors filled in and protruding above said first and second trenches, respectively;
first and second hard mask films deposited on said first and second metal conductors, respectively;
a first sidewall formed on a first lateral surface of said first hard mask film and said first metal conductor and disposed above said second interlayer film;
a second sidewall formed on a second lateral surface of said second hard mask film and said second metal conductor and disposed above said second interlayer film, said second sidewall being opposed to said first sidewall;
a third interlayer film formed on a top surface of said second interlayer film inclusive of said first and second hard mask films and said first and second sidewalls;
a contact hole opened through said third interlayer film and said second interlayer film and in said first interlayer film, to expose said first contact metal part between said first and second sidewalls; and
a second contact metal part filled in said contact hole and said second contact metal part contacting said first and second sidewalls.

* * * * *